US012671423B2

(12) United States Patent　　　　(10) Patent No.:　US 12,671,423 B2
Pang　　　　　　　　　　　　　　　　(45) Date of Patent:　Jun. 30, 2026

(54) CLOCK AND DATA RECOVERY CIRCUIT SUITABLE FOR HIGH-SPEED SerDes AND RECOVERY METHOD

(71) Applicant: NANJING QINHENG MICROELECTRONICS CO., LTD., Nanjing (CN)

(72) Inventor: Yubo Pang, Nanjing (CN)

(73) Assignee: NANJING QINHENG MICROELECTRONICS CO., LTD., Nanjing (CN)

( * ) Notice: Subject to any disclaimer, the term of this patent is extended or adjusted under 35 U.S.C. 154(b) by 0 days.

(21) Appl. No.: 19/321,774

(22) Filed: Sep. 8, 2025

(65) Prior Publication Data

US 2026/0155827 A1　　Jun. 4, 2026

(30) Foreign Application Priority Data

Dec. 2, 2024　　(CN) ......................... 202411751156.3

(51) Int. Cl.
　H03L 7/08　　　　(2006.01)
　H03L 7/093　　　(2006.01)
　H03L 7/099　　　(2006.01)
(52) U.S. Cl.
　CPC ............ H03L 7/0807 (2013.01); H03L 7/093 (2013.01); H03L 7/0998 (2013.01)
(58) Field of Classification Search
　CPC ...... H03L 7/0807; H03L 7/093; H03L 7/0998

USPC .......................................................... 375/376
See application file for complete search history.

(56) References Cited

U.S. PATENT DOCUMENTS

| | | | |
|---|---|---|---|
| 9,559,836 B1* | 1/2017 | Hata ..................... | H04L 7/0337 |
| 2014/0126656 A1 | 5/2014 | Chung et al. | |
| 2015/0103961 A1 | 4/2015 | Malipatil et al. | |
| 2018/0219704 A1* | 8/2018 | Song ..................... | H03L 7/0814 |

FOREIGN PATENT DOCUMENTS

| | | |
|---|---|---|
| CN | 110995257 A | 4/2020 |
| CN | 114448595 A | 5/2022 |
| CN | 116054990 A | 5/2023 |

* cited by examiner

*Primary Examiner* — Kevin M Burd
(74) *Attorney, Agent, or Firm* — CBM PATENT CONSULTING, LLC

(57) ABSTRACT

Disclosed are a clock and data recovery circuit suitable for high-speed SerDes and a recovery method. The circuit comprises: an analog front end, which inputs a receiving signal and outputs a result of a phase detector; a phase discrimination accumulator, which is used for accumulating the result of the phase detector; a gain control unit, which is used for adjusting a gain of a trunk signal; a first branch, which comprises a proportion voter and a phase gain unit; a second branch, which comprises a weight voter and a frequency integration unit; an adder, which is used for adding output results of the phase gain unit and the frequency integration unit, wherein an output of the adder sequentially passes through a phase accumulator and a phase interpolator; and the phase interpolator, which is used for outputting a sampling clock for the analog front end to use.

7 Claims, 9 Drawing Sheets

CLOCK AND DATA RECOVERY CIRCUIT SUITABLE FOR HIGH-SPEED SerDes AND RECOVERY METHOD

CROSS-REFERENCE TO RELATED APPLICATIONS

This application claims priority to Chinese Patent Application Ser. No. CN2024117511563 filed 2 Dec. 2024.

TECHNICAL FIELD

The present invention relates to the technical field of high-speed SerDes communication, and particularly to a clock and data recovery circuit suitable for high-speed SerDes and a recovery method.

BACKGROUND

Clock and data recovery (CDR) is a core link in a SerDes system. At present, related technologies are mainly suitable for high-speed serial data communication, such as PCIE/USB3.0/SRIO/JESD204/vehicle-mounted Ethernet, etc. A CDR performance directly determines a bit error rate of the SerDes system. However, in some application scenarios, such as a digital equalizer, failed phase tracking may directly lead to an equalization offset, and intersymbol interference (ISI) is increased. In practical application, a form of fixed parameters is adopted to maintain a stability of the system in most cases, and the structure tends to be a linear system, so that a system performance can be qualitatively analyzed by modeling the system. However, because of achieving a rounding error of an algorithm number and a nonlinearity of a circuit, and other reasons, the system generally presents nonlinear characteristics, there is often a big error between a result of linear system model analysis and an actual effect, and a bit error rate cannot meet index requirements.

In an existing CDR loop, a phase gain unit and a frequency integration unit share the same proportion voter, so that each part of the system may obtain a set of certain parameters by formula derivation, thereby linearly predicting a system performance of the whole CDR loop. However, in an actual system, because digital circuits all adopt a fixed-point number, there must be a rounding error, especially in the frequency integration unit, because of the rounding error, the whole CDR system produces a random jitter, which is an accumulative frequency error. A phase accumulator may also have the rounding error. In addition, one part of nonlinearity of a phase interpolator may produce a periodic jitter, and the other part of nonlinearity may produce a random jitter, so that a very large jitter may be introduced by the whole CDR system. This jitter is fed back to a front end of a phase detector because of a loop, which is amplified by the gain control unit, linearly amplified by the proportion voter, and then applied in the phase gain unit and the frequency integration unit, so that the whole system is in a vicious cycle, and finally, the overall system performance is reduced, which is inconsistent with the expectation of an ideal linear system, leading to the failure of system modeling and the difficulty in parameter selection.

SUMMARY

Objective of the invention: in order to solve the problems of difficult parameter selection of a CDR loop and easy occurrence of a frequency offset error in the prior art, the present invention provides a clock and data recovery circuit suitable for high-speed SerDes and a recovery method.

Technical solution: a clock and data recovery circuit suitable for high-speed SerDes comprises:

- an analog front end, which inputs a receiving signal and outputs a result of a phase detector;
- a phase discrimination accumulator, which is used for accumulating the result of the phase detector;
- a gain control unit, which is used for adjusting a gain of a trunk signal;
- a first branch, which comprises a proportion voter and a phase gain unit;
- a second branch, which comprises a weight voter and a frequency integration unit;
- an adder, which is used for adding output results of the phase gain unit and the frequency integration unit, wherein an output of the adder sequentially passes through a phase accumulator and a phase interpolator; and
- the phase interpolator, which is used for outputting a sampling clock for the analog front end to use.

Further, the weight voter is used for linear amplification when an absolute value of an accumulative value of phase discrimination exceeds a weight limit value, no adjustment is made when the absolute value of the accumulative value of phase discrimination does not exceed the weight limit value, and the weight voter is expressed as follows:

$$Kv2 = \begin{cases} 0, & |pd| < \alpha \\ \gamma, & |pd| \ge \alpha \end{cases} \tag{1}$$

wherein, $\gamma$ is a gain coefficient of the weight voter, $\alpha$ is the set weight limit value, pd is the accumulative value of phase discrimination, and Kv2 is an output of the weight voter.

Further, the proportion voter is used for linear amplification under any accumulative value of phase discrimination, and the proportion voter is expressed as follows:

$$Kv1 = \beta \tag{2}$$

wherein, $\beta$ is a gain coefficient of the proportion voter, and Kv1 is an output of the proportion voter.

Further, the frequency integration unit is further provided with a frequency offset limiter, and a maximum value of an allowable frequency offset is set for the frequency offset limiter.

Further, the phase interpolator is further provided with a jump step size limiter, and a maximum value of an allowable phase jump is set for the jump step size limiter.

A clock and data recovery method suitable for high-speed SerDes adopting the clock and data recovery circuit suitable for high-speed SerDes above comprises the following steps of:

- receiving a signal by the analog front end, then subjecting the received signal to front-end processing under an action of the sampling clock, outputting results of multiple phase detectors, and accumulating the results of the multiple phase detectors to obtain the accumulative value of phase discrimination;
- when the accumulative value of phase discrimination is less than the preset weight limit value, adjusting the phase gain unit only, and when the accumulative value of phase discrimination is greater than the preset weight limit value, synchronously adjusting the phase gain unit and the frequency integration unit;

adding the results of the phase gain unit and the frequency integration unit by the adder, and then allowing the output of the adder to sequentially pass through the phase accumulator and the phase interpolator, so as to output the adjusted sampling clock, wherein the sampling clock is provided for the analog front end to use; and under constant adjustment of the sampling clock unit CDR locking, recovering the sampling clock, and recovering data by the analog front end.

Further, a specific adjustment method comprises: inputting the accumulative value of phase discrimination into the first branch and the second branch at the same time, wherein, in the first branch, under an action of the proportion voter, when the accumulative value of phase discrimination is positive, the phase gain unit is adjusted positively, when the accumulative value of phase discrimination is negative, the phase gain unit is adjusted negatively, and when the accumulative value of phase discrimination is zero, a current sampling clock phase is appropriate, and the phase gain unit is not adjusted; and in the second branch, under an action of the weight voter, in a case that the absolute value of the accumulative value of phase discrimination is greater than the preset weight limit value, when the accumulative value of phase discrimination is positive, the frequency integration unit is adjusted positively, and when the accumulative value of phase discrimination is negative, the frequency integration unit is adjusted negatively, and in a case that the absolute value of the accumulative value of phase discrimination is not greater than the preset weight limit value, the frequency integration unit is not adjusted.

Further, a specific adjustment method comprises: in an adjustment process of the frequency integration unit, limiting a maximum value of a frequency offset, and making a frequency offset step size fall within a maximum value range.

Further, a specific adjustment method comprises: in a phase interpolation process, limiting a maximum value of a jump step size of the phase interpolator, and making the phase jump step size fall within a maximum value range.

Compared with the prior art, the clock and data recovery circuit suitable for high-speed SerDes and the recovery method provided by the present invention have the following beneficial effects.

According to the accumulative value of phase discrimination, different adjustment methods are selected, when the accumulative value of phase discrimination is small, only the phase gain unit is adjusted timely, and when the accumulative value of phase discrimination is large, the phase gain unit and the frequency integration unit are adjusted synchronously, so that the problem that the system cannot make timely response to a small error can be effectively avoided, and CDR locking is high in speed and short in time consumption. Meanwhile, a lot of non-ideal jitters are shielded, so that the frequency offset error of the system and the accumulative error of the system are greatly reduced, and finally, a recovered clock is as close to a data edge as possible, thereby strengthening a tracking effect of clock jitter and ensuring overall performance improvement of the system.

DETAILED DESCRIPTION

The present invention is further explained and described hereinafter with reference to the drawings and specific embodiments.

Figure 1:
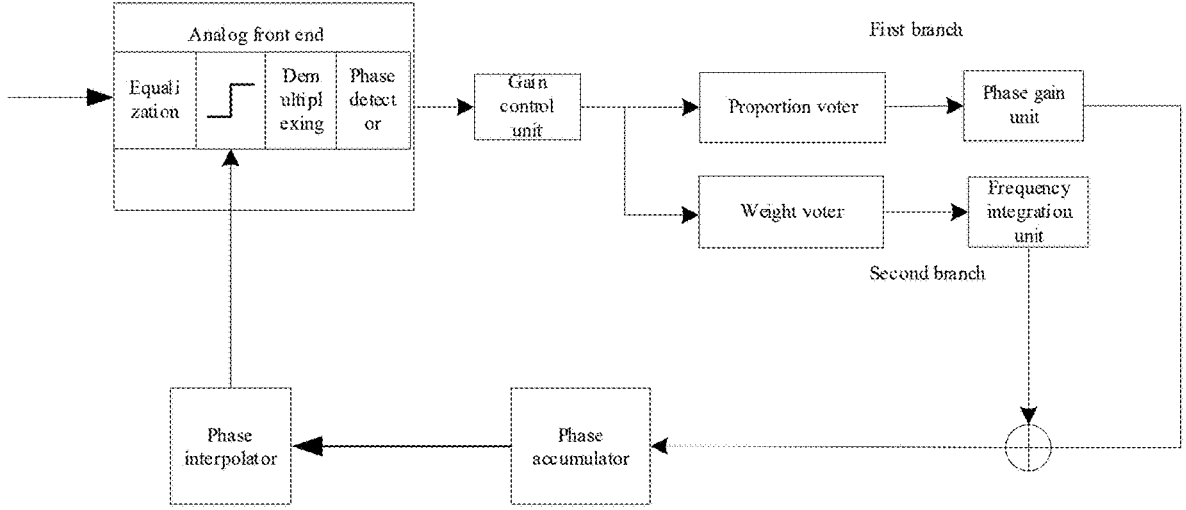
FIG. 1 is a schematic structural diagram of a clock and data recovery circuit suitable for high-speed SerDes.
Figure 2:
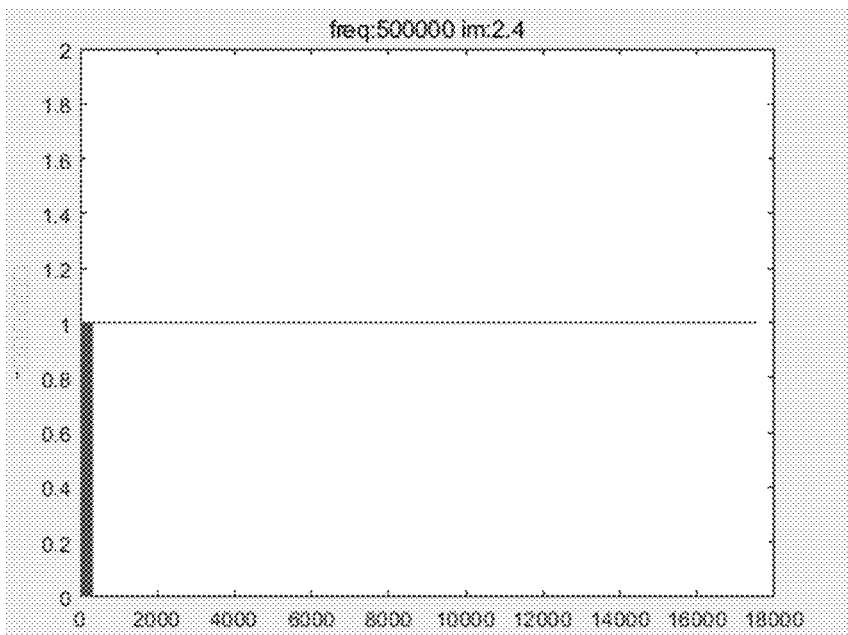
FIG. 2 is a graph of experimental results of a method when an input jitter is 2.4 UI@500K.
Figure 3:
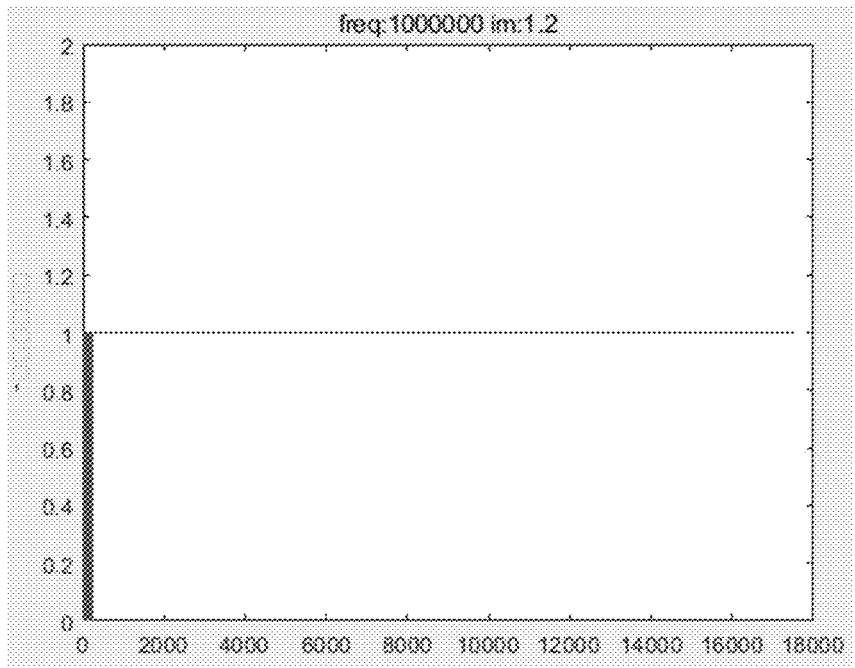
FIG. 3 is a graph of experimental results of the method when the input jitter is 1.2 UI@1 M.
Figure 4:
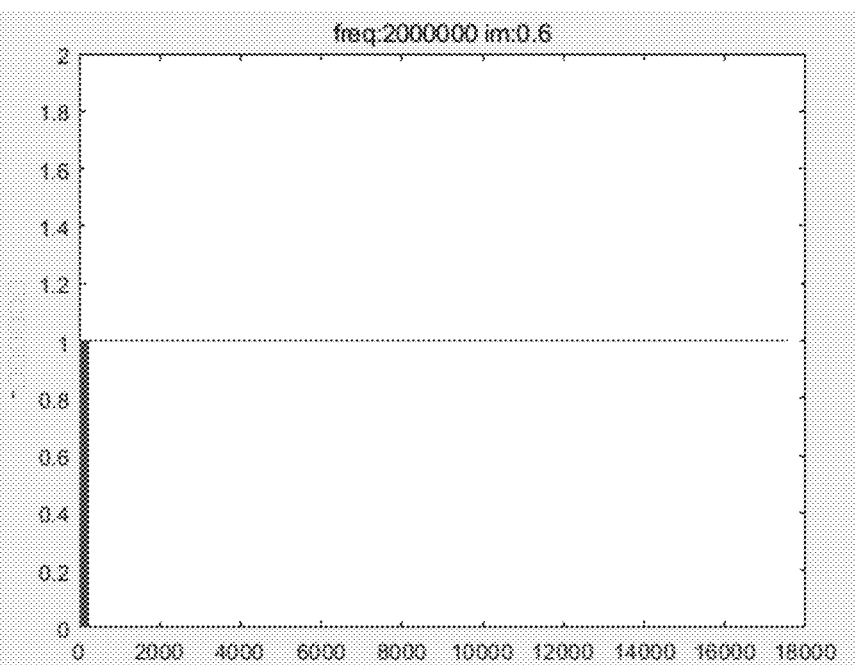
FIG. 4 is a graph of experimental results of the method when the input jitter is 0.6 UI@2 M.
Figure 5:
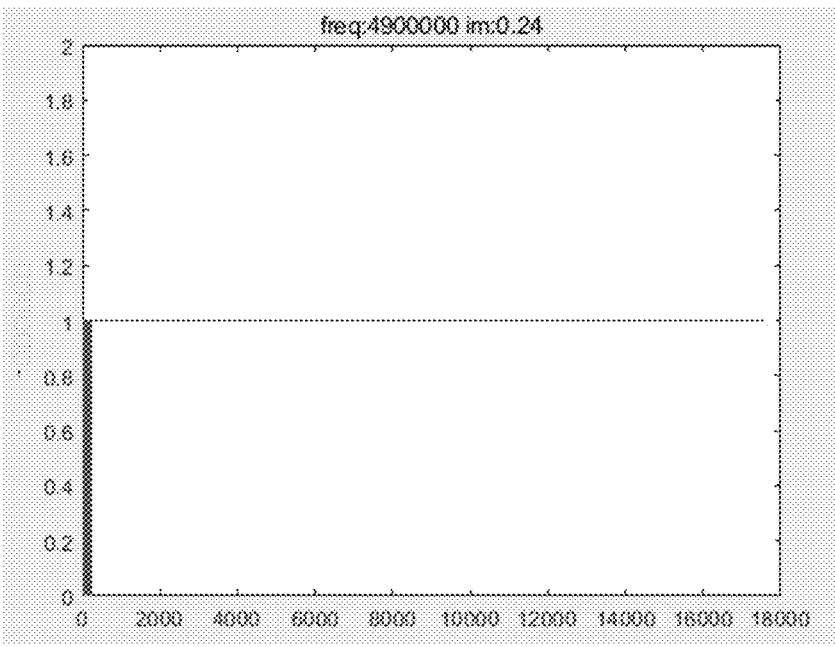
FIG. 5 is a graph of experimental results of the method when the input jitter is 0.24 UI@4.9 M.
Figure 6:
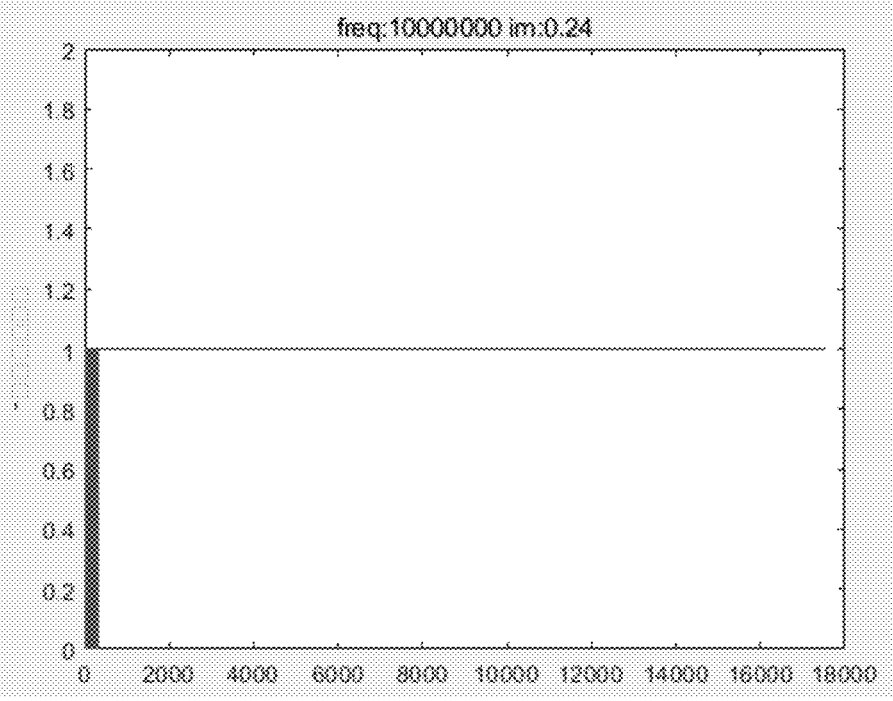
FIG. 6 is a graph of experimental results of the method when the input jitter is 0.24 UI@10 M.
Figure 7:
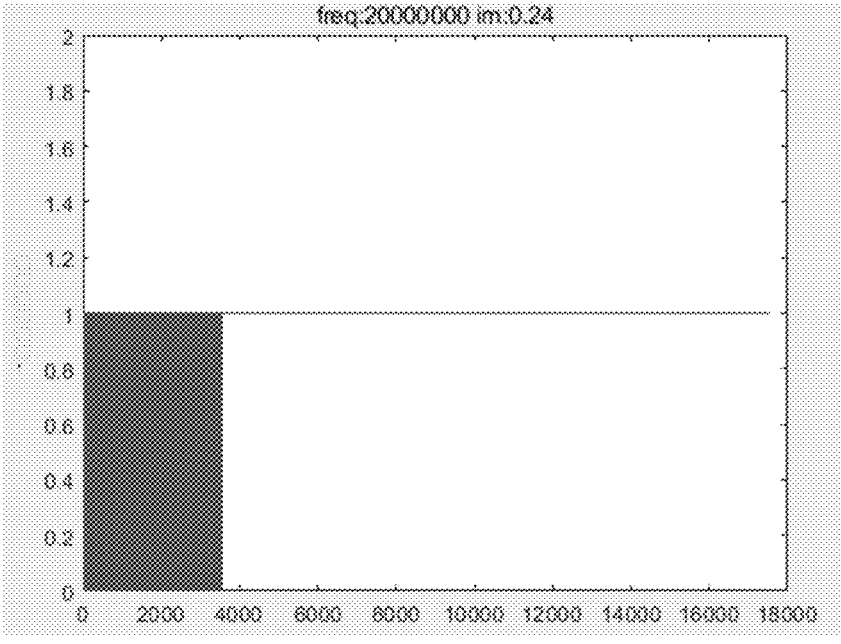
FIG. 7 is a graph of experimental results of the method when the input jitter is 0.24 UI@20 M.
Figure 8:
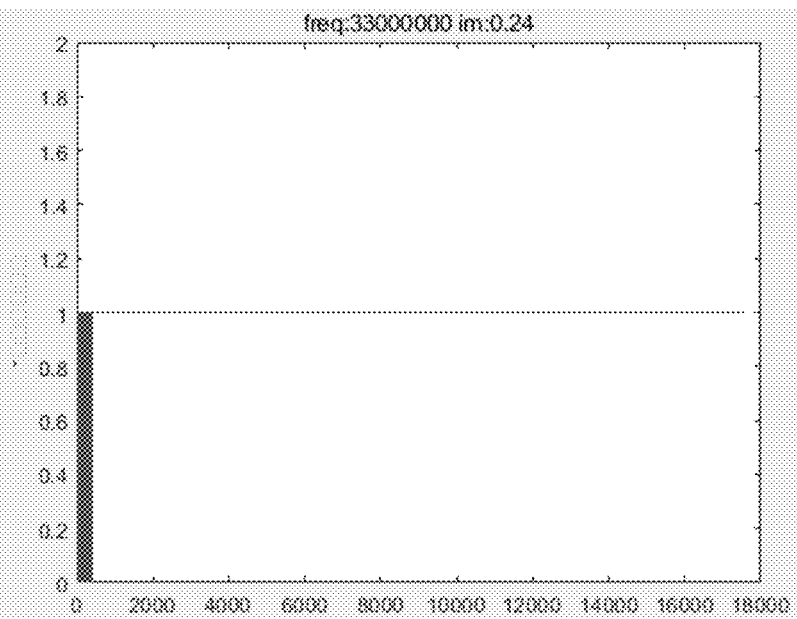
FIG. 8 is a graph of experimental results of the method when the input jitter is 0.24 UI@33 M.
Figure 9:
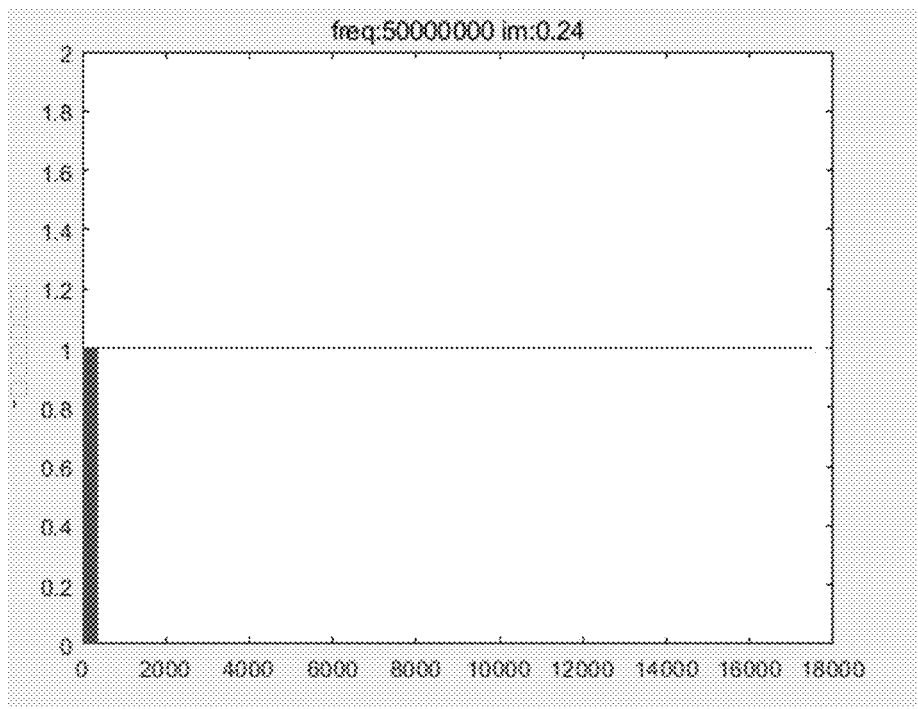
FIG. 9 is a graph of experimental results of the method when the input jitter is 0.24 UI@50 M.
Figure 10:
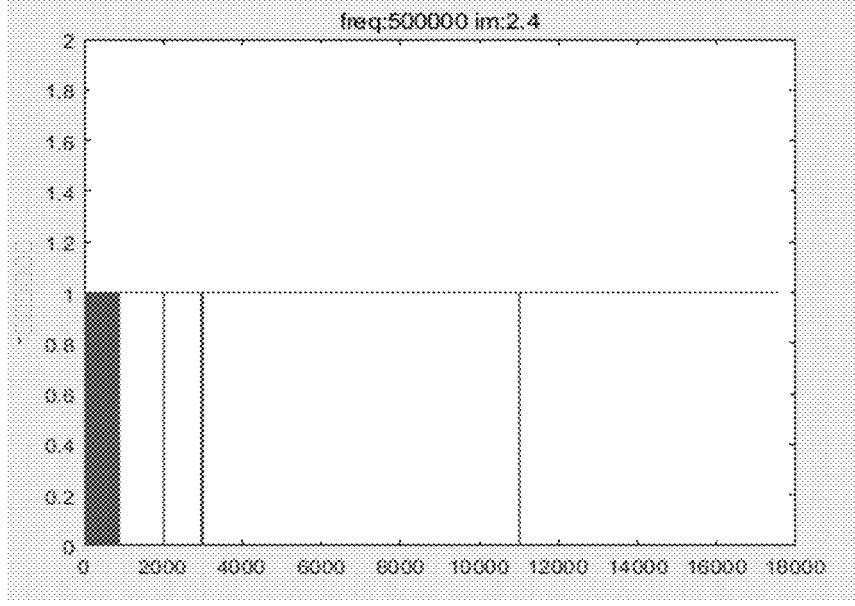
FIG. 10 is a graph of experimental results of a traditional method when the input jitter is 2.4 UI@500K.
Figure 11:
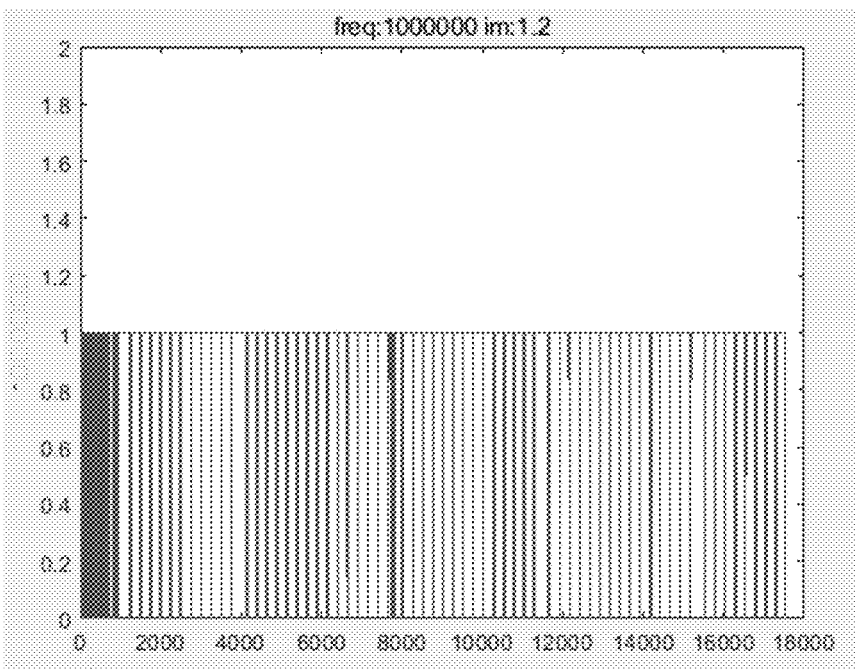
FIG. 11 is a graph of experimental results of the traditional method when the input jitter is 1.2 UI@1 M.
Figure 12:
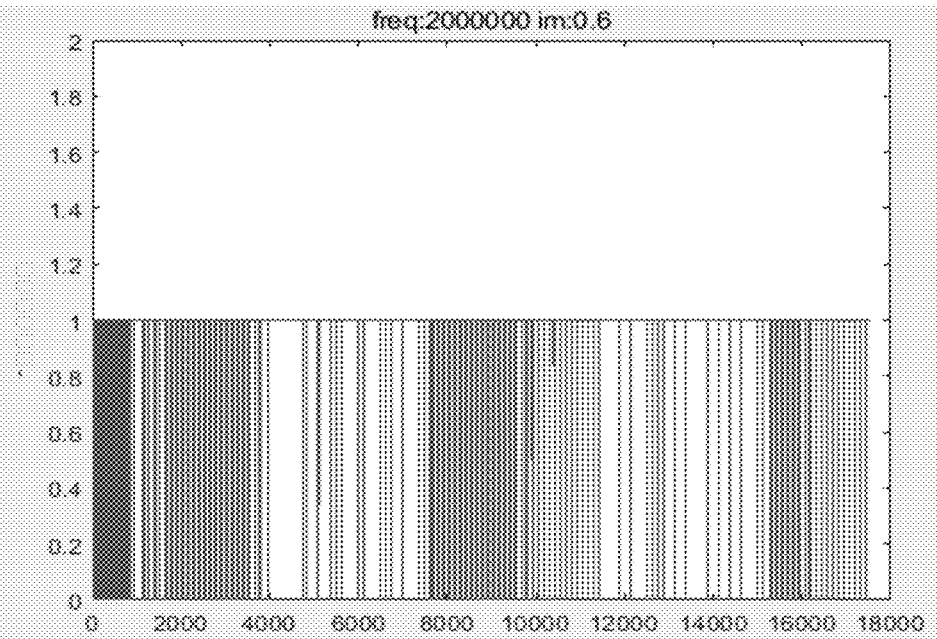
FIG. 12 is a graph of experimental results of the traditional method when the input jitter is 0.6 UI@2 M.
Figure 13:
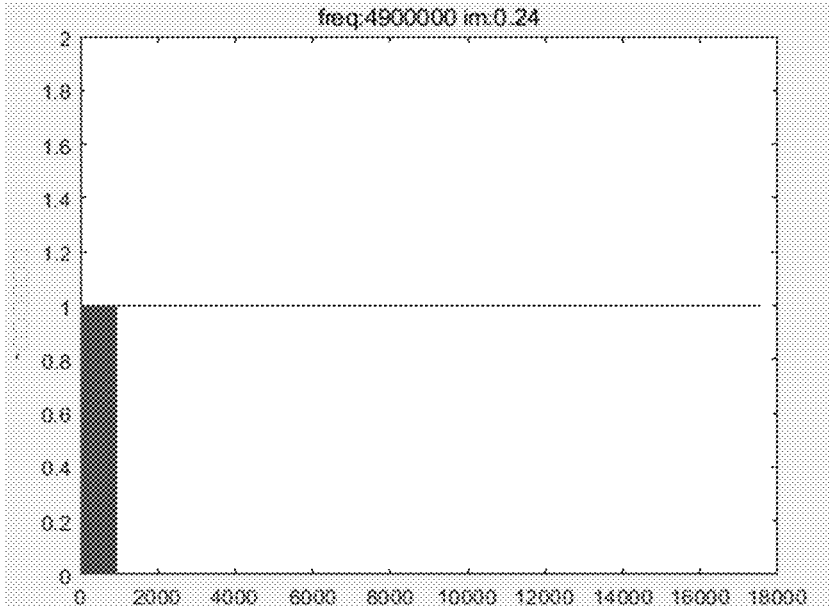
FIG. 13 is a graph of experimental results of the traditional method when the input jitter is 0.24 UI@4.9 M.
Figure 14:
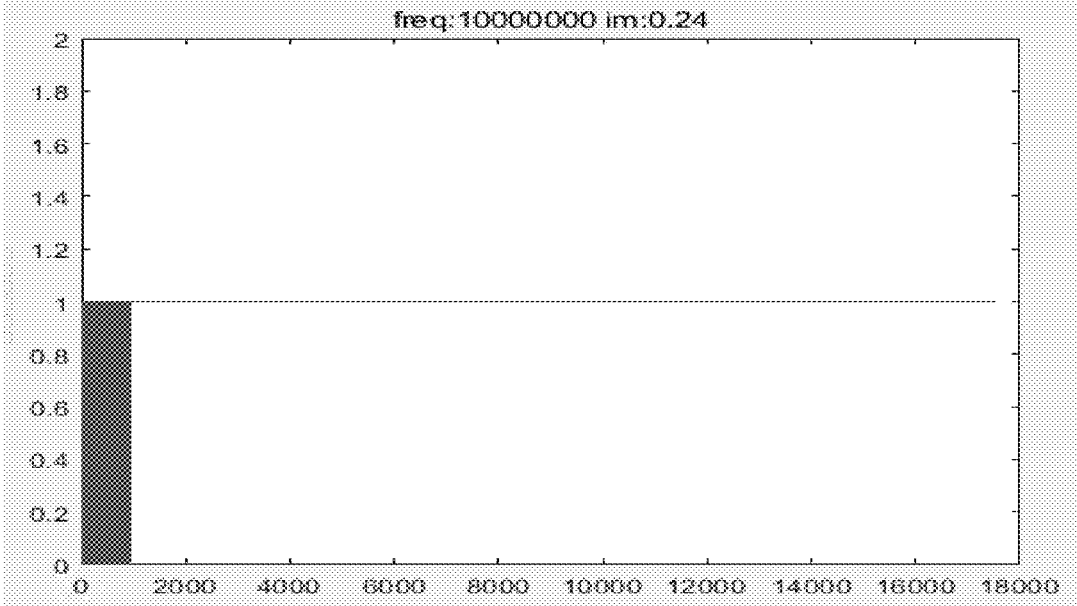
FIG. 14 is a graph of experimental results of the traditional method when the input jitter is 0.24 UI@10 M.
Figure 15:
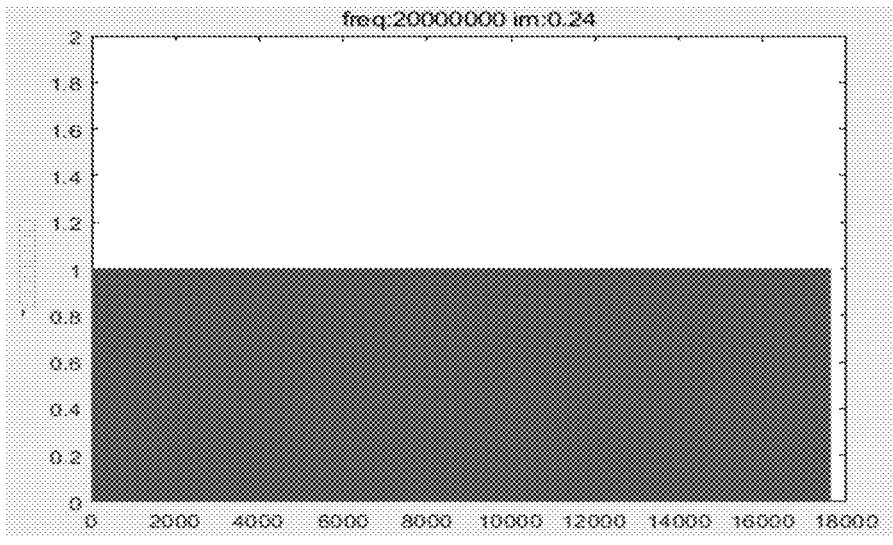
FIG. 15 is a graph of experimental results of the traditional method when the input jitter is 0.24 UI@20 M.
Figure 16:
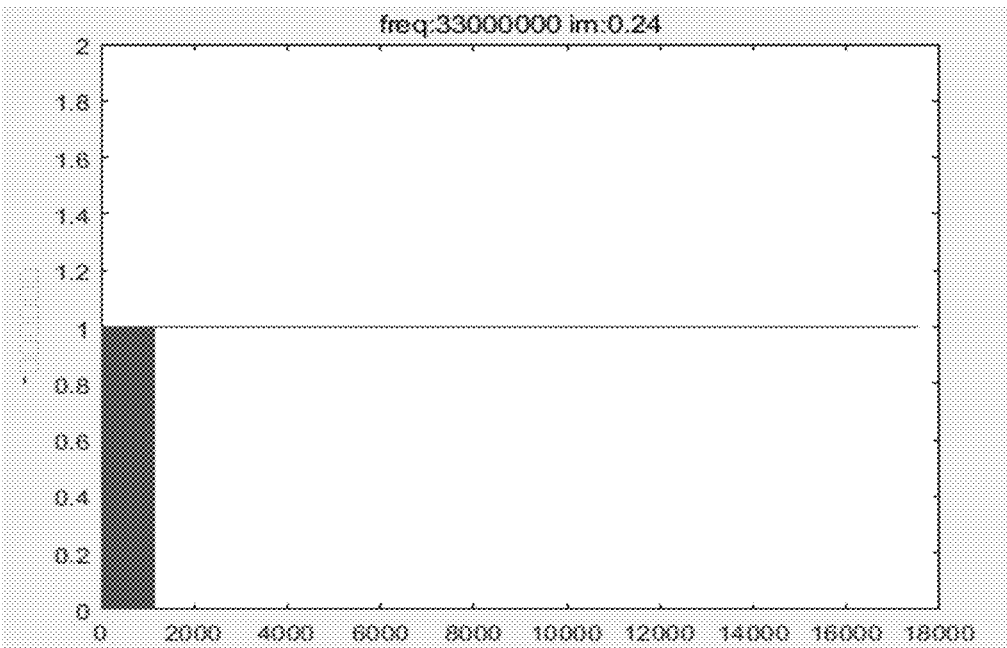
FIG. 16 is a graph of experimental results of the traditional method when the input jitter is 0.24 UI@33 M.
Figure 17:
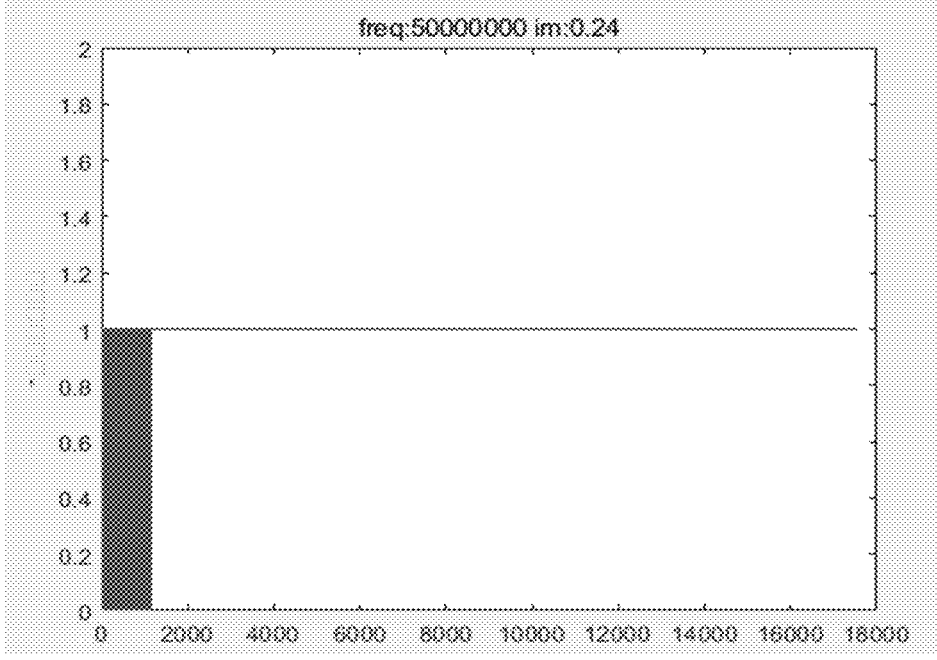
FIG. 17 is a graph of experimental results of the traditional method when the input jitter is 0.24 UI@50 M.

A clock and data recovery circuit suitable for high-speed SerDes, as shown in FIG. 1, comprises:

an analog front end, which inputs a receiving signal and outputs a result of a phase detector;

a phase discrimination accumulator, which is used for accumulating the result of the phase detector;

a gain control unit, which is used for adjusting a gain of a trunk signal;

a first branch, which comprises a proportion voter and a phase gain unit;

a second branch, which comprises a weight voter and a frequency integration unit;

an adder, which is used for adding output results of the phase gain unit and the frequency integration unit, wherein an output of the adder sequentially passes through a phase accumulator and a phase interpolator; and the phase interpolator, which is used for outputting a sampling clock for the analog front end to use.

wherein, the weight voter is used for linear amplification when an absolute value of an accumulative value of phase discrimination exceeds a weight limit value, no adjustment is made when the absolute value of the accumulative value of phase discrimination does not exceed the weight limit value, and the weight voter is expressed as follows:

$$Kv2 = \begin{cases} 0, & |pd| < \alpha \\ \gamma, & |pd| \ge \alpha \end{cases}. \qquad (1)$$

wherein, $\gamma$ is a gain coefficient of the weight voter, $\alpha$ is the set weight limit value, pd is the accumulative value of phase discrimination, and Kv2 is an output of the weight voter.

The proportion voter is used for linear amplification under any accumulative value of phase discrimination, and the proportion voter is expressed as follows:

$$Kv1 = \beta \qquad (2)$$

wherein, $\beta$ is a gain coefficient of the proportion voter, and Kv1 is an output of the proportion voter.

The proportion voter is used for basically filtering the phase gain unit, and the phase gain unit is used for compensating a large phase offset, so that a receiving clock quickly approaches an edge of a transmitting clock at an opposite end in a short time.

The weight voter makes a weighted decision for an accumulative value of phase discrimination based on a certain weight coefficient, instead of linearly amplifying each accumulative value of phase discrimination.

The frequency integration unit is used for accumulating potential energy during phase branch adjustment, which essentially refers to making a statistic for a past phase adjustment trend, thereby achieving a similar purpose of predicting a phase offset in a next period, so that the system is capable of tracking a large frequency offset.

Considering that error accumulation of the system loop mainly affects the frequency integration unit, an accumulative error of this branch has a long-term impact on the CDR system, so that there is the greatest impact on the performance. Therefore, the phase gain unit and the frequency integration unit are isolated by the proportion voter and the weight voter respectively, so that a loop gain and a jitter tolerance become formulas (3) and (4) respectively:

$$\zeta(z^{-1}) = \begin{cases} \left(\dfrac{K_P K_{PD} \beta K_{DPC} K_G}{1 - z^{-1}}\right) \cdot z^{-N_{EL}}, & |pd| < \alpha \\ \left(\dfrac{K_{PD} \beta K_{DPC} K_G}{1 - z^{-1}}\right) \cdot \left(K_P + \dfrac{K_I}{(1 - z^{-1})}\right) \cdot z^{-N_{EL}}, & |pd| \ge \alpha \end{cases} \qquad (3)$$

$$\tilde{\psi}_{JTOL}(z^{-1}) = \left\{ \left(1 - \dfrac{14.068\sigma_j}{T_{UI}}\right) \cdot (1 + \zeta(z^{-1})) \right\} \qquad (4)$$

In this way, the system is in a linear adjustment state regardless of an interval of the accumulative value of phase discrimination, when the accumulative value of phase discrimination is less than a, the phase gain unit is mainly adjusted timely adjustment, and when the accumulative value of phase discrimination is greater than a, the frequency integration unit and the phase gain unit are adjusted synchronously, so that the problem that the system cannot make timely response to a small error can be effectively avoided. Meanwhile, a lot of non-ideal jitters are shielded, so that the accumulative error of the system is greatly reduced, thereby ensuring overall performance improvement of the system.

In addition, considering extreme situations that may be encountered in some engineering implementation processes, such as the existence of some interference signals, leading to a situation that the phase frequency offset is excessively large and may overflow or a clock jitter at an opposite end cannot be tracked, the frequency integration unit may further be provided with a frequency offset limiter, and a maximum value of a frequency offset is set for the frequency offset limiter. The maximum value is set according to the corresponding design index requirements, such as the SPEC index. The limiter can ensure that the system can track the clock jitter at the opposite end in any initial state.

However, the phase interpolator may also have disadvantages of an excessively large adjustment step size, an insufficient circuit response speed and edge missing of an interpolation clock, so that the phase interpolator may further be provided with a jump step size limiter, and a maximum value of a phase jump is set for the jump step size limiter. It is ensured that an allowable maximum phase adjustment step size in each period is limited in a case of satisfying a maximum jitter rate index specified by SPEC.

A clock and data recovery method suitable for high-speed SerDes adopting the clock and data recovery circuit suitable for high-speed SerDes above comprises the following steps.

A signal is received by the analog front end, then the received signal is subjected to front-end processing under an action of the sampling clock, results of multiple phase detectors are output, and the results of the multiple phase detectors are accumulated to obtain the accumulative value of phase discrimination.

When the accumulative value of phase discrimination is less than the preset weight limit value, only the phase gain unit is adjusted, and when the accumulative value of phase discrimination is greater than the preset weight limit value, the phase gain unit and the frequency integration unit are adjusted synchronously.

A specific adjustment method comprises: inputting the accumulative value of phase discrimination into the first branch and the second branch at the same time, wherein, in the first branch, under an action of the proportion voter, when the accumulative value of phase discrimination is positive, the phase gain unit is adjusted positively, when the accumulative value of phase discrimination is negative, the phase gain unit is adjusted negatively, and when the accumulative value of phase discrimination is zero, a current sampling clock phase is appropriate, and the phase gain unit is not adjusted; and in the second branch, under an action of the weight voter, in a case that the absolute value of the accumulative value of phase discrimination is greater than the preset weight limit value, when the accumulative value of phase discrimination is positive, the frequency integration unit is adjusted positively, and when the accumulative value of phase discrimination is negative, the frequency integration unit is adjusted negatively, and in a case that the absolute value of the accumulative value of phase discrimination is not greater than the preset weight limit value, the frequency integration branch is not adjusted.

The results of the phase gain unit and the frequency integration unit are added by the adder, and then the output of the adder sequentially passes through the phase accumulator and the phase interpolator, so as to output the adjusted sampling clock, wherein the sampling clock is provided for the analog front end to use.

Under constant adjustment of the sampling clock until CDR locking, the sampling clock is recovered, and data are recovered by the analog front end.

In addition, in order to avoid a negative impact of the extreme situations that may be encountered in engineering implementation, in an adjustment process of the frequency integration unit, a maximum value of a frequency offset is also limited, and a frequency offset step size needs to fall within a maximum value range, for example, the maximum value of the frequency offset in this embodiment is limited to ±5000 ppm.

In a phase interpolation process, a maximum value of a jump step size of the phase interpolator may further be limited, and a phase interpolation adjustment step size needs to be less than the maximum value, for example, the maximum value of the phase interpolation adjustment step size in this embodiment is ±2.

In order to verify an effect of the clock and data recovery method suitable for high-speed SerDes, the following comparative simulation experiment is carried out, and simulation test results of the method and the prior art are respectively as shown in FIG. 2-17. Under the same test conditions, a value of $\alpha$ is set to be 4, a channel attenuation is set to be −21.9 dB@2.5G, and (a)-(h) respectively show opening conditions of eye patterns of recovery tested (a reserved eye width of recovery is 50 ps) under various jitter working conditions in which input jitters are 2.4 UI@500K, 1.2 UI@1 M, 0.6 UI@2 M, 0.24 UI@4.9 M, 0.24 UI@10 M, 0.24 UI@20 M, 0.24 UI@33 M and 0.24 UI@50 M (1.2 times that specified in the spec). It can be seen that an error probability in FIG. 2-9 are significantly lower than that in FIG. 10-17 (after convergence, there is no messy glitch, and a vertical axis indicates a CDR locking state. 1: locked. 0: unlocked).

What is claimed is:

1. A clock and data recovery circuit suitable for high-speed SerDes, comprising:

an analog front end, which inputs a receiving signal and outputs a result of a phase detector;

a phase discrimination accumulator, which is used for accumulating the result of the phase detector;

a gain control unit, which is used for adjusting a gain of a trunk signal;

a first branch, which comprises a proportion voter and a phase gain unit;

a second branch, which comprises a weight voter and a frequency integration unit;

an adder, which is used for adding output results of the phase gain unit and the frequency integration unit, wherein an output of the adder sequentially passes through a phase accumulator and a phase interpolator; and the phase interpolator, which is used for outputting a sampling clock for the analog front end to use;

wherein, the weight voter is used for linear amplification when an absolute value of an accumulative value of phase discrimination exceeds a weight limit value, no adjustment is made when the absolute value of the accumulative value of phase discrimination does not exceed the weight limit value, and the weight voter is expressed as follows:

$$Kv2 = \begin{cases} 0, & |pd| < \alpha \\ \gamma, & |pd| \ge \alpha \end{cases} \tag{1}$$

wherein, $\gamma$ is a gain coefficient of the weight voter, $\alpha$ is the set weight limit value, pd is the accumulative value of phase discrimination, and Kv2 is an output of the weight voter; and the proportion voter is used for linear amplification under any accumulative value of phase discrimination, and the proportion voter is expressed as follows:

$$Kv1 = \beta \tag{2}$$

wherein, $\beta$ is a gain coefficient of the proportion voter, and Kv1 is an output of the proportion voter.

2. The clock and data recovery circuit suitable for high-speed SerDes according to claim 1, wherein the frequency integration unit is further provided with a frequency offset limiter, and a maximum value of an allowable frequency offset is set for the frequency offset limiter.

3. The clock and data recovery circuit suitable for high-speed SerDes according to claim 1, wherein the phase interpolator is further provided with a jump step size limiter, and a maximum value of an allowable phase jump is set for the jump step size limiter.

4. A clock and data recovery method suitable for high-speed SerDes adopting the clock and data recovery circuit suitable for high-speed SerDes according to claim 1, comprising the following steps of:

receiving a signal by the analog front end, then subjecting the received signal to front-end processing under an action of the sampling clock, outputting results of multiple phase detectors, and accumulating the results of the multiple phase detectors to obtain the accumulative value of phase discrimination;

when the accumulative value of phase discrimination is less than the preset weight limit value, adjusting the phase gain unit only, and when the accumulative value of phase discrimination is greater than the preset weight limit value, synchronously adjusting the phase gain unit and the frequency integration unit;

adding the results of the phase gain unit and the frequency integration unit by the adder, and then allowing the output of the adder to sequentially pass through the phase accumulator and the phase interpolator, so as to output the adjusted sampling clock, wherein the sampling clock is provided for the analog front end to use; and under constant adjustment of the sampling clock until CDR locking, recovering the sampling clock, and recovering data by the analog front end.

5. The clock and data recovery method suitable for high-speed SerDes according to claim 4, wherein a specific adjustment method comprises: inputting the accumulative value of phase discrimination into the first branch and the second branch at the same time, wherein, in the first branch, under an action of the proportion voter, when the accumulative value of phase discrimination is positive, the phase gain unit is adjusted positively, when the accumulative value of phase discrimination is negative, the phase gain unit is adjusted negatively, and when the accumulative value of phase discrimination is zero, a current sampling clock phase is appropriate, and the phase gain unit is not adjusted; and in the second branch, under an action of the weight voter, in a case that the absolute value of the accumulative value of phase discrimination is greater than the preset weight limit value, when the accumulative value of phase discrimination is positive, the frequency integration unit is adjusted positively, and when the accumulative value of phase discrimination is negative, the frequency integration unit is adjusted negatively, and in a case that the absolute value of the accumulative value of phase discrimination is not greater than the preset weight limit value, the frequency integration unit is not adjusted.

6. The clock and data recovery method suitable for high-speed SerDes according to claim 4, wherein a specific adjustment method comprises: in an adjustment process of the frequency integration unit, limiting a maximum value of a frequency offset, and making a frequency offset step size fall within a maximum value range.

7. The clock and data recovery method suitable for high-speed SerDes according to claim 4, wherein a specific adjustment method comprises: in a phase interpolation process, limiting a maximum value of a jump step size of the phase interpolator, and making the phase jump step size fall within a maximum value range.

\* \* \* \* \*